United States Patent [19]

Fasang et al.

[11] Patent Number: 4,602,210

[45] Date of Patent: Jul. 22, 1986

[54] MULTIPLEXED-ACCESS SCAN TESTABLE INTEGRATED CIRCUIT

[75] Inventors: Patrick P. Fasang, Raleigh, N.C.; John P. Shen, Oakmont, Pa.

[73] Assignee: General Electric Company, Syracuse, N.Y.

[21] Appl. No.: 687,357

[22] Filed: Dec. 28, 1984

[51] Int. Cl.$^4$ ............................................. G01R 31/28
[52] U.S. Cl. ..................................... 324/73 R; 371/15
[58] Field of Search ............ 324/73 R, 73 AT, 158 R; 307/440, 445; 371/15, 16, 25

[56] References Cited

U.S. PATENT DOCUMENTS 4,267,463  5/1981  Mayumi ............................ 324/73 R
4,286,173  8/1981  Oka et al. ........................... 324/73 R

OTHER PUBLICATIONS

Schraeder, M. W.; "Multiplexed Measuring . . . "; EDN; May 12, 1982; pp. 187-190.
Faran, Jr., J. J.; "Methods of Assignment . . . "; 1982, IEEE Test Conference; May 1982; pp. 641-647.

*Primary Examiner*—Ernest F. Karlsen
*Attorney, Agent, or Firm*—Robert J. Mooney

[57] ABSTRACT

A testable integrated circuit contains additional circuitry which defines—when operable in a test mode—a plurality of scan paths in each of which are connected in series a plurality of bistable elements (specifically, special scan path flip-flops) isolated from the integrated circuit combinational circuits. The input and output ends of these scan paths are connected by multi-level demultiplexer and multiplexer arrangements with the input and output pins, respectively, of the integrated circuit. The last level demultiplexer and the last level multiplexer include first groups of connections with the input and output ends of the scan paths, respectively, and second groups of connections with the input and output ends of the mission logic. The demultiplexers, the multiplexers and the scan path flip-flops are operable between mission and test modes upon the application of a mode control signal thereto. When the circuit is in the test mode, a test signal applied to the inputs of the scan paths is monitored at the output ends of the paths to indicate the correctness of operation of the SPFF's in each path. Composite test vectors are then applied for testing the combinational circuits via the SPFF's and primary inputs to the said combinational circuits.

9 Claims, 12 Drawing Figures

MULTIPLEXED-ACCESS SCAN TESTABLE INTEGRATED CIRCUIT

STATEMENT OF THE INVENTION

An integrated circuit is provided containing additional circuitry which affords quick cost-effective testing, characterized by the use of a set of on-chip multiplexers and demultiplexers which permit the sharing of the same set of pins by both the mission inputs/outputs and test data input/outputs.

BRIEF DESCRIPTION OF THE PRIOR ART

Various methods for testing integrated circuits has been proposed in the prior art. In the Eichelberger U.S. Pat. Nos. 3,783,254 and 3,761,695, a level sensitive scan design technique is disclosed which allows a design to chain the flip-flops into a serial shift register during testing time. The testing of the flip-flops reduces down to shifting a known sequence of 0's and 1's into the shift register and shifting the whole sequence out of the register. If the output sequence agrees with the input sequence, then the flip-flops are assumed to contain no single-stuck-line faults. This method has the disadvantage in that it is slow because the flip-flops are chained into a serial shift register. H. Ando described a technique called Random Access Scan in a paper entitled "Testing VLSI with Random Access Scan", published in the Digest of Papers, COMPCON-80, February 1980, pp.50-52. This technique allows one to access all flip-flops in a random manner (as opposed to a sequential manner) and therefore reduces the scan time greatly. However, the overhead is high because a set of selection lines is needed to select the flip-flops.

The Oka et al. U.S. Pat. No. 4,286,173 and Mayumi U.S. Pat. No. 4,267,463 disclose the use of multiplexer logic for reducing the number of input or output lines necessary to test integrated circuit logic. In Mayumi, the multiplexers permit operational and test data to share common pins. In the Van Brunt U.S. Pat. No. 4,357,703, transmission gates on LSI chips decrease the number of test data pins required on the LSI chip. The Kasuya U.S. Pat. No. 4,366,393 discloses an easily testable integrated logic circuit which uses a plurality of flip-flops to form a feedback shift register, which circuit is operable to test combinational circuits.

It is furthermore known in the multiplexing communications art—as evidenced for example, by the Stephens U.S. Pat. No. 3,809,819—to provide multiple levels of multiplexers to channel many paths into a single transmission line.

As the IC technology progresses, the amount of circuitry and hence functionality also increase. However, the number of pins on the IC package does not increase nearly as much as the amount of circuitry, and hence the functionality to pin ratio becomes increasingly large. Associated with the increase in complexity is the increase in cost in testing to determine if a circuit is good or bad. It is not unusual that a VLSI chip tester costs 3 million dollars. Researchers have been trying to come up with ways for making testing of chips and boards more effective and less time consuming.

SUMMARY OF THE INVENTION

The present invention was developed to permit the testing of integrated circuits (at the LSI and VLSI levels and above) by incorporating additional circuitry including a multilevel set of on-chip multiplexers and demultiplexers to allow the sharing of the same set of pins by both the mission inputs/outputs and test data inputs/outputs, hence requiring no additional pins for test data inputs and outputs. Furthermore the methodology described in this invention allows the designer to design an IC in such a way that the overhead in hardware and the testing time together is minimized. The invention allows the designer to select the optimum number of scan paths and hence the optimum length of each path. A semicustom circuit is one in which the user can put an application specific type of circuit in an integrated circuit, and the IC is built up from a predefined mask or array of gates (i.e., the IC is not built up from scratch). The general goals of the work on design for testability of semicustom VLSI circuits are threefold. The first goal is to enhance testability by increasing test access through controllability and observability and by decreasing test generation cost and testing time and cost. The second goal is to reduce delay and timing problems by ensuring reliable and well-behaved operation, by helping to ease simulation and other computer aided design tasks, and by promoting disciplined and conservative design style. The third goal is to develop automated tools and design aids to minimize the design requirements that must be imposed on the designers to automate the procedure for producing testable designs, and to provide aids to designers for making testability/overhead tradeoff decisions.

Accordingly, a primary object of the present invention is to provide a testable integrated circuit in which the bistable elements are connected in a test mode to define a plurality of scan paths isolated from the combinational circuits of the IC, on-chip multilevel multiplexer means being provided to allow sharing of the same pins by the mission input as well as the test data inputs, whereby the requirement for additional pins for test data inputs is eliminated.

According to a more specific object of the invention, the bistable elements comprise special scan path flip-flops (SPFF's) having scan-path multiplexers embedded therein, whereby the chip can alternately accept either mission or test data. During operation in the test mode, groups of the bistable elements are connected together in series to define a number of scan paths of generally equal maximum length. The input ends of these scan paths are connected with the input pins of the IC chip via multilevel demultiplexer means, and the output ends are connected with the chip output pins via multilevel multiplexer means. When a binary test pattern signal (for example, 01100) is applied in a bit-by-bit manner to the input end of each scan path and the scan path is clocked a given number of times (for example, a number equal to the number of flip-flops in the scan path, plus five), the output signal monitored at the output end of each scan path gives an indication of the operability of the bistable elements in that scan path.

According to another object of the invention, the input and output ends of the scan paths are connected with the outputs and inputs of first level demultiplexer and multiplexer means, respectively, and the inputs and outputs of these first level demultiplexer and multiplexer means are connected with a part of the outputs and inputs of second level demultiplexer and multiplexer means, respectively. The remainder of the outputs and inputs of the second level demultiplexer and multiplexer means are connected with the input and output ends of the mission logic means. These multilevel demultiplexer and multiplexer means are operable between mission and test modes simultaneously with the operation of the scan path flip-flops. Consequently, in accordance with a characterizing feature of the testing method of the invention, when the IC to be tested is initially placed in the test mode (to establish the scan paths and to isolate the combinational circuits), the test pattern signal (01100, for example) is applied to the input ends of the scan paths, and the scan paths are clocked a number of times equal to the scan path length L (i.e., the number of flip-flops in the scan path) plus the number of bits in the test pattern (namely, five in the illustrated example). The output of each scan path is monitored to give an indication of the operability of the SPFF's in that scan path. With the IC circuit in the test mode, a complex two-part test vector is applied to the scan path inputs, whereby a first part of the complex test vector conditions or "arms" the combinational circuits (via the scan path flip-flops), and a second part serves as a test signal input to the combinational circuit. The polarity of the control signal is changed to place the circuit in the mission mode, whereupon the circuit is clocked once to capture the outputs of the combinational circuits with the scan path flip-flops. The circuit is again placed in the test mode by the application of the control signal, whereupon the scan paths are clocked L times and are monitored to determine the conditions of the combinational circuits.

The building blocks of the invention consist of scan path flip-flops (SPFF) and latches (SPL). The SPFF is similar to a regular flip-flop except that it has a multiplexer to channel either the mission data input or the test data input into the flip-flop. The SPL is a latch which behaves like a regular latch during mission mode but behaves like a master-slave flip-flop during test mode. The scan path inputs and outputs are multiplexed (by the multilever multiplexer and demultiplexer means) with the mission primary inputs and outputs, and consequently there are no additional pin requirements for scan path inputs or outputs. Furthermore, if there is a need for further multiplexing among the scan paths themselves, a second level of multiplexer(s) and demultiplexer(s) can be used. If the number of inputs/outputs for the mission mode is larger or smaller than those of the test mode, some outputs/inputs may be used as inputs/outputs by converting the unidirectional I/O's to bidirectional I/O's, thereby using existing pins for mission and test modes. The special building blocks used for this purpose are primary input/output pins, bidirectional I/O cells, and multiplexers.

All scan path flip-flops are controlled by the four global signals consisting of the two phases of the two-phase clock, the input-select control signal, and the mode-select control signal, and all asynchronous feedback loops are eliminated by the insertion of an SPFF in each loop. The data input of each SPFF must not be a combinational function of the clock signals, and output function circuits feeding primary outputs must not contain any reconvergent fanouts. These rules ensure that the final design will be a "well-behaved" circuit, thereby avoiding critical races and hazards. A race is a condition in which two or more signals change concurrently. A critical race is one in which the order in which the signals actually occur may lead to a malfunction (erroneous circuit behavior). A hazard is an erroneous signal change or spike caused by races. The clock signals and control signals directly control, except for intervening fanout distribution circuitry, all scan-path elements, and the phases of a two-phase clock must be nonoverlapping.

BRIEF DESCRIPTION OF THE DRAWING

Other objects and advantages of the invention will become apparent from a study of the following specification, when viewed in the light of the accompanying drawings, in which.

DETAILED DESCRIPTION

Figure 1:
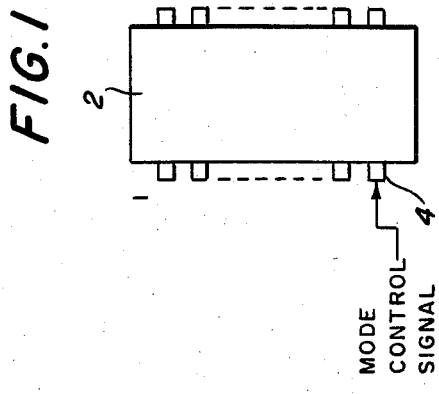
FIG. 1 is a diagrammatic representation of the IC chip of the present invention.

Referring to FIGS. 1, the integrated circuit chip 2, which is of the very large scale (VLSI) type or higher, is provided with a number of input and output pins, L through j, including a mode control pin 4. The circuit includes large numbers of sequential (bistable) elements (such as flip-flops) and combinational elements (i.e., non-memory elements).

Figure 3:
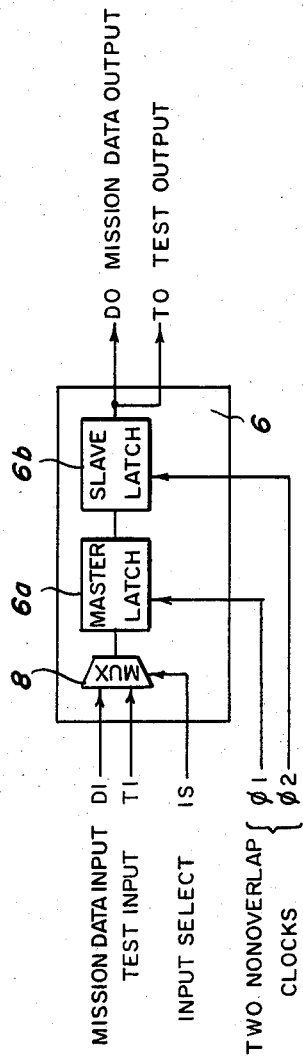
FIGS. 2 and 3 are diagrammatic representations of in-stream scan path flip-flops (SPFF's) in accordance with the present invention.
Figure 2:
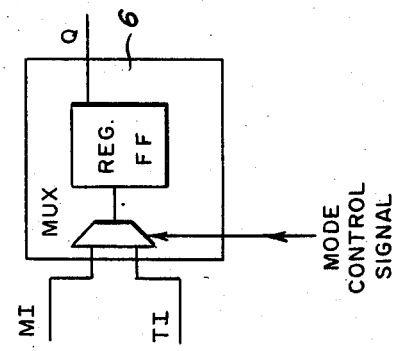

In accordance with a characterizing feature of the invention, each sequential element 6 is provided with means for switching the same between mission (i.e., functional) and test modes. Referring to FIG. 2, the flip-flop FF is alternately supplied with mission and test input signals $M_I$ and $T_I$, respectively, via a multiplexer MUX the state of operation of which is controlled by a control signal input. In the illustration of the instream component of FIG. 3, mission and test inputs are alternately supplied via multiplexer 8 which is controlled by the input select signal IS, and the component includes master and slave latches 6a, 6b supplied with non-overlap clock signals $\phi 1$ and $\phi 2$, respectively. In the outstream arrangement of FIG. 4, input and output multiplexers 10 and 12, respectively, are provided to partition large combinational blocks and to buffer primary inputs and outputs during the test mode.

Figure 5:
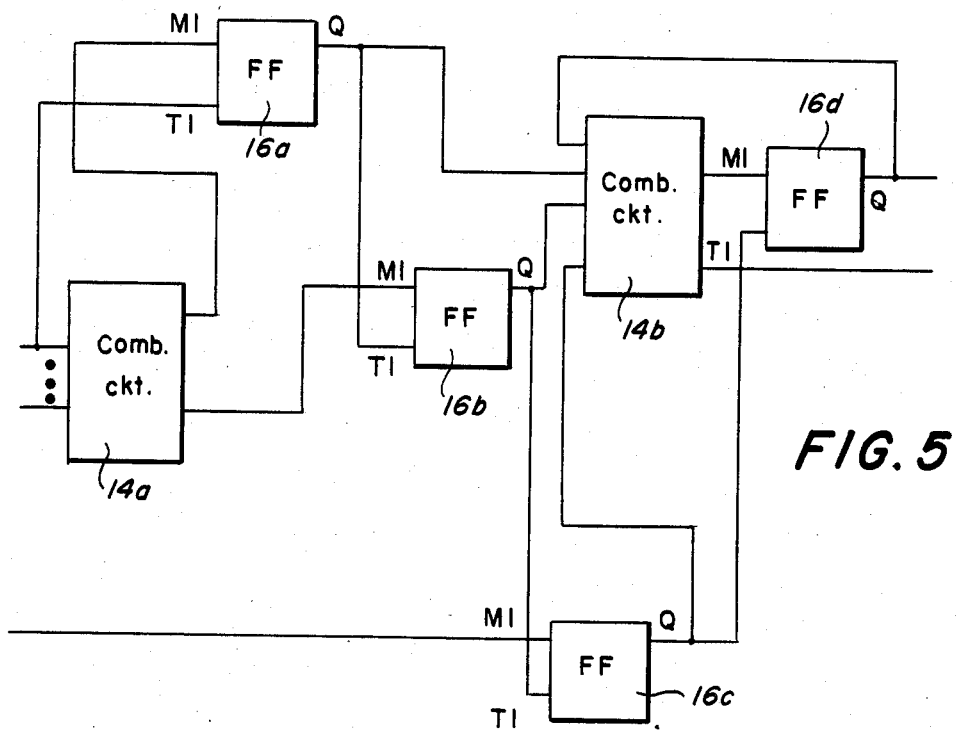
FIGS. 5 and 6 are illustrative of the isolation of the combinational circuits when the IC circuit is switched from the mission mode to the test mode.
Figure 6:
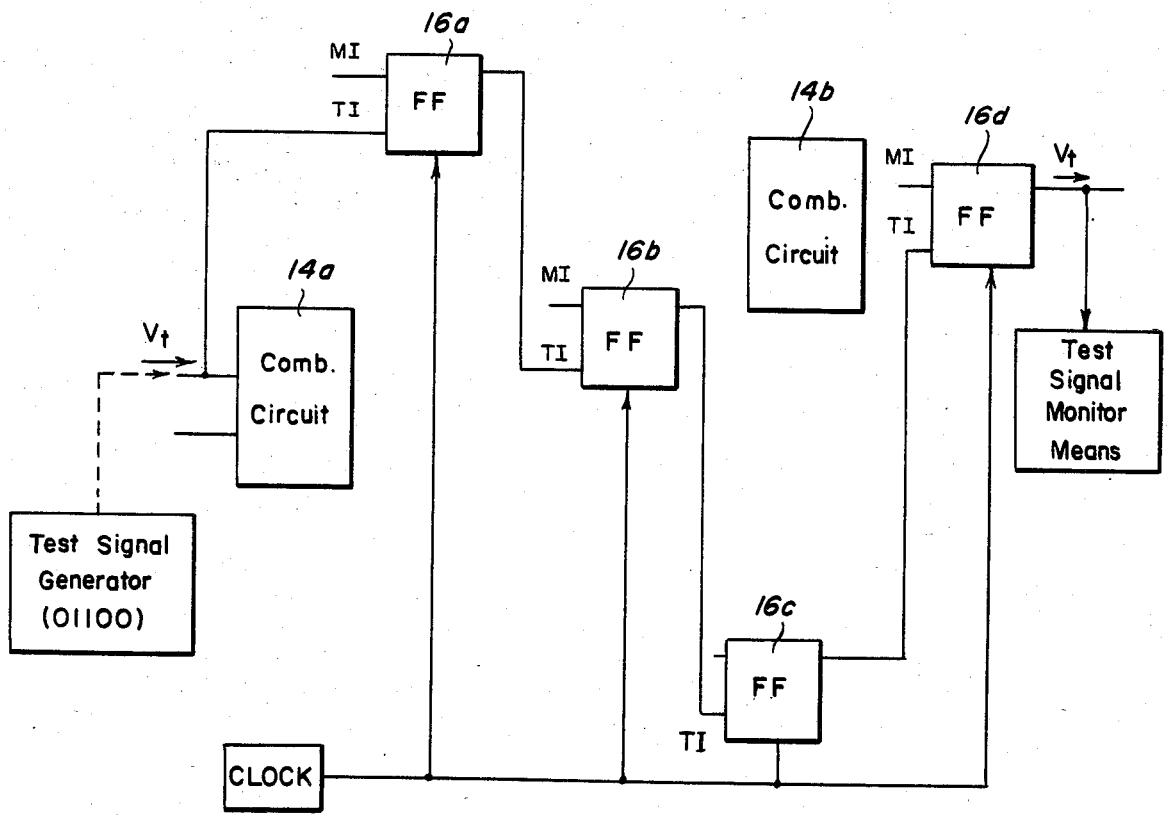
Figure 7:
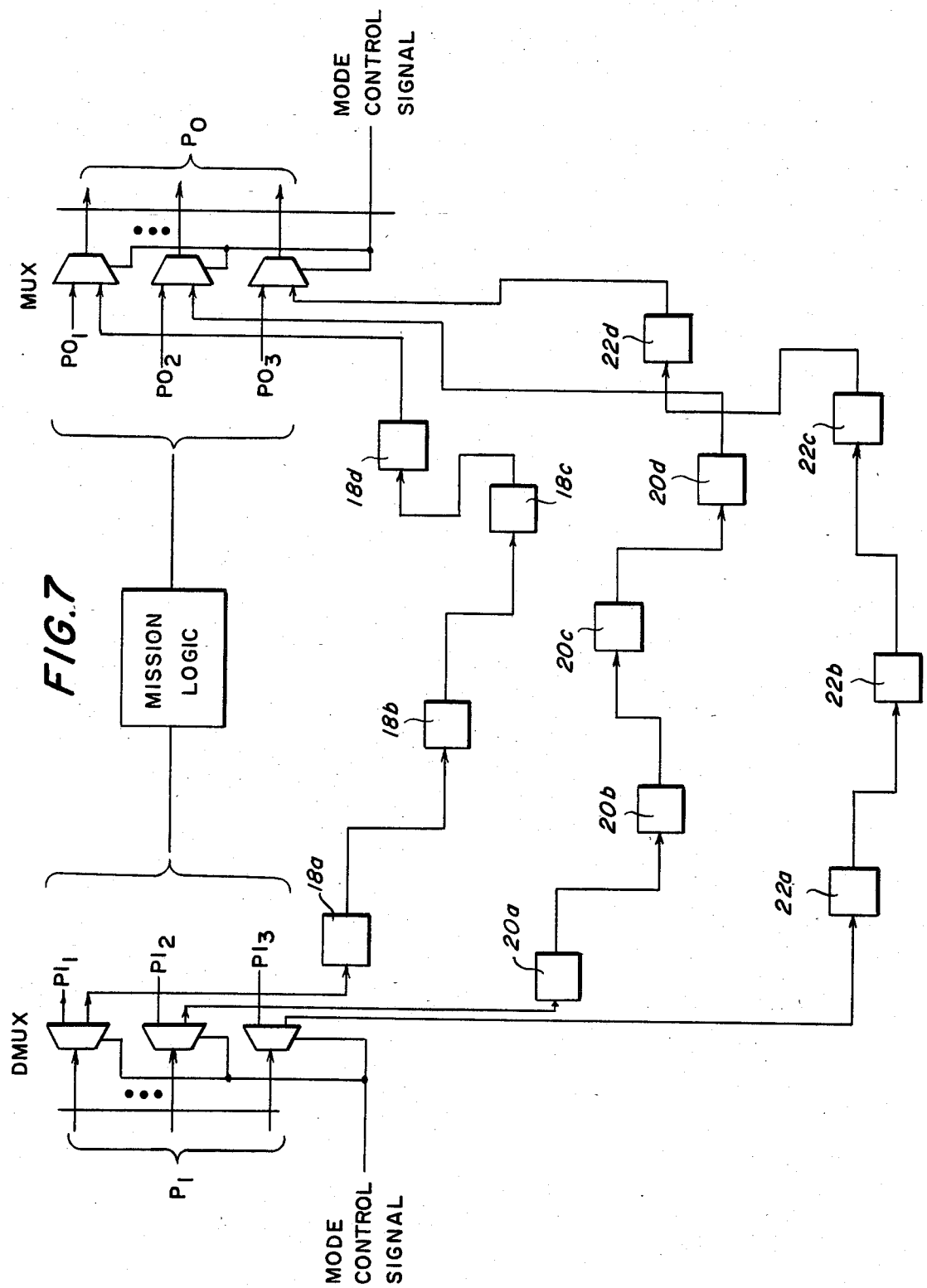
FIG. 7 is a schematic representation of the manner in which the demultiplexers and multiplexers alternately connect the inputs with the mission logic and with the scan paths, respectively.

Referring now to FIG. 5, for purposes of explanation, the integrated circuit of chip 2 of FIG. 1 may be considered to consist of a plurality of combinational circuits 14a, 14b and a plurality of sequential elements 16a–16d. In accordance with another characterizing feature of the invention, the sequential elements are so connected by the conductors of the integrated circuit that when the test mode select signal is supplied to the multiplex mode selecting means of the sequential components, the combinational circuits are isolated from the integrated circuit and groups of the sequential components are connected in series to define a plurality of scan paths (SP) (one of which is shown in FIG. 6). When a binary test signal pattern $V_t$ (for example, 01100) is applied bit-by-bit to the input end of the scan path, the flip-flops of the scan path are clocked a number of times corresponding with the number of flip-flops in that scan path, plus the number of bits in the test signal. The output of that scan path is monitored to indicate the operability of the flip-flops in that scan path. In the system of FIG. 7, the mode control signals applied to the input demultiplexers DMUX and to the output multiplexers MUX connect the sequential elements in series to define the three paths 18a-18d, 20a-20d and 22a-22d, respectively.

Figure 8:
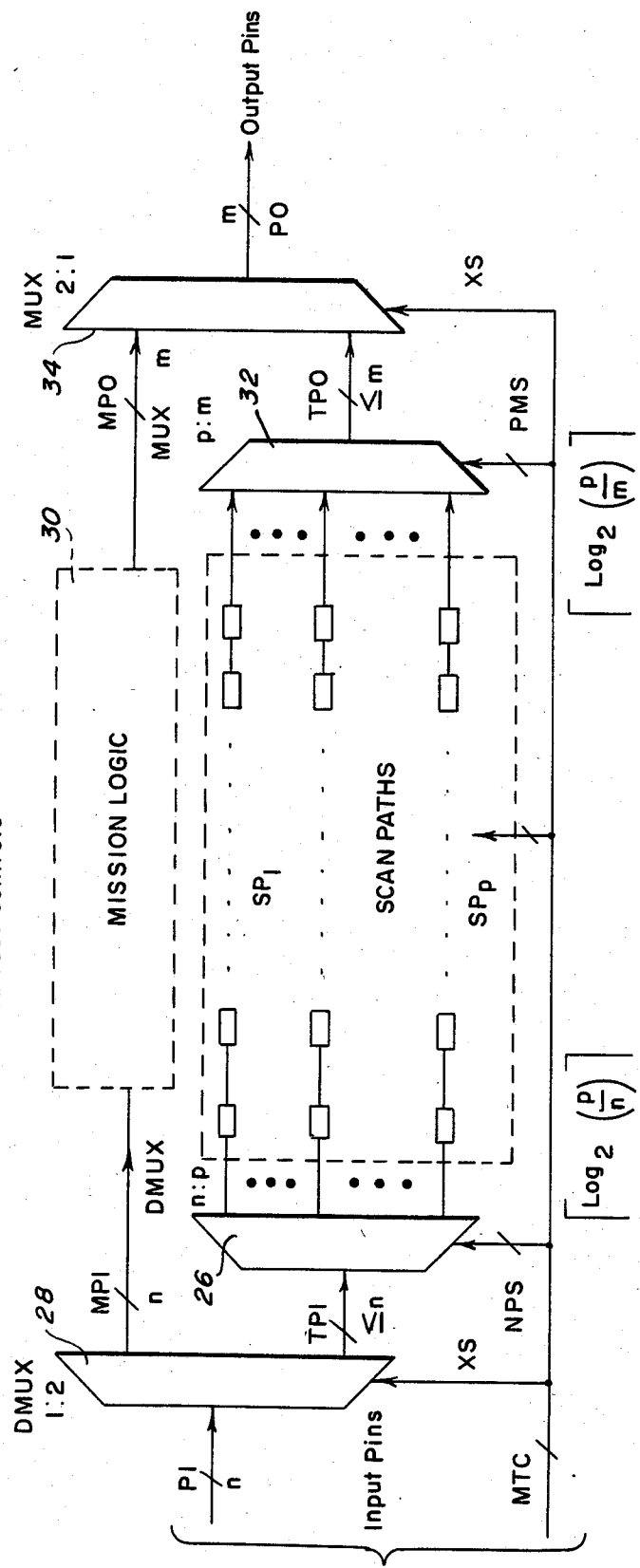
FIGS. 8 and 9 are simplified and detailed views of a preferred embodiment of the present invention.

Referring now to the present invention as illustrated in FIG. 8, the input ends of the scan paths $SP_1$-$SP_p$ are connected with the outputs, respectively, of a first demultiplexer (DMUX) 26 having a ratio n:p, where:

n = number of DMUX input lines
p = number of scan paths
f = total number of scan path flip-flops SPFF
L = maximum scan path length (i.e., number of flip-flops in a scan path).

$$\left\lceil \log_2\left(\frac{p}{n}\right) \right\rceil$$

= number of control lines needed to select n:p (DMUX)

Connected with the input terminals of the first demultiplexer 26 are a number of the output terminals (equal to or less than n) of a second level demultiplexer 28 having a 1:2 ratio. This second demultiplexer has n inputs and a second set of n outputs connected with the inputs, respectively of the mission logic circuit 30. The outputs of the scan paths are connected with the inputs of a p:m multiplexer (MUX) 32, where:

m = the number of outputs from the mission logic circuit $$\left\lceil \log_2\left(\frac{p}{m}\right) \right\rceil$$

= number of control lines needed to select p:m (MUX)

Figure 9:
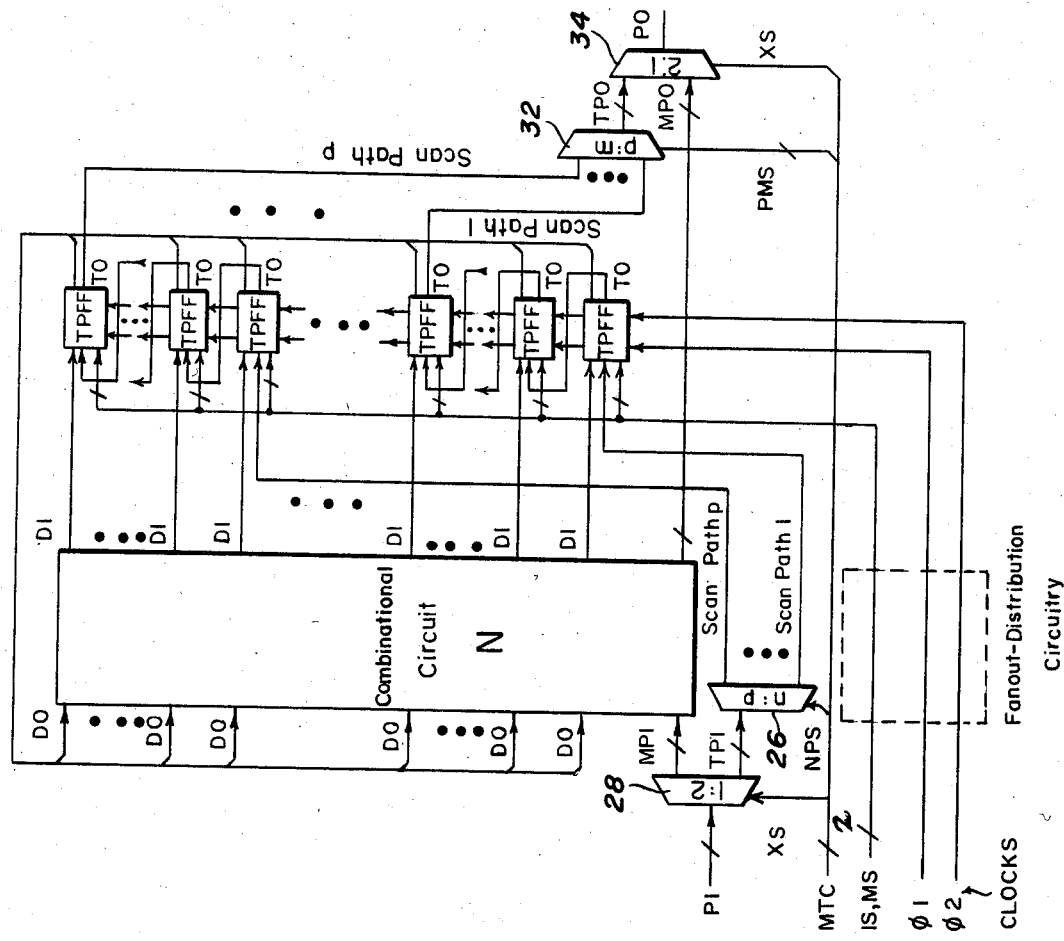

The number of outputs of this multiplexer 32 is equal to or less than m, which outputs are supplied to a first group of inputs to the 2:1 multiplexer (MUX) 34. This second multiplexer includes a second group of inputs m to which are connected the outputs of the mission logic 30, respectively, the second multiplexer having m outputs. The mode control signal MTC operates between the mission and test modes the demultiplexers 26,28, the multiplexers 32 and 34, and the individual scan path flip-flops. The clock signals $\phi 1$ and $\phi 2$ are applied to the more detailed circuit of FIG. 9. Arbitrary preliminary requirements are:

$$L = \left\lceil \frac{f}{p} \right\rceil \leq 10 \text{ (arbitrary)}$$

$$\left\lceil \log_2\left(\frac{p}{n}\right) \right\rceil + \log_2\left(\frac{p}{m}\right) \leq 5 \text{ (arbitrary)}$$

total number of additional ≦ 8 (arbitrary) input/output pins

The scan path (SP) design provides complete control for monitoring all storage elements and reduces the test generation and application problem down to a combinational one. The multiplexed access (MA) mechanism can drastically reduce the testing time, which is a critical weakness of prior art approaches.

Figure 4:
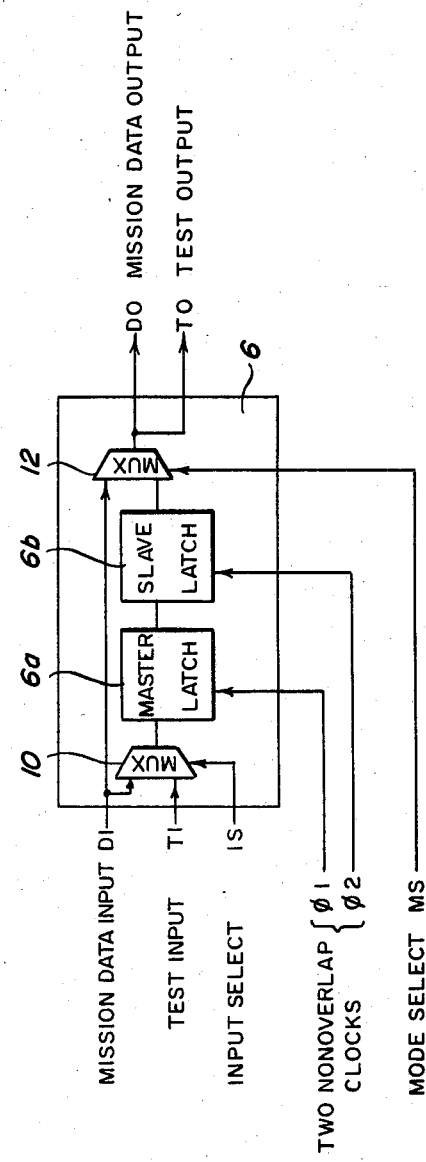
FIG. 4 is a diagrammatic illustration of the outstream scan path flip-flop (OSPFF) arrangement for partitioning large combinational blocks and for buffering the primary inputs and outputs during the test mode.

For clocking and control of the scan path flip-flops (SPFF's) of FIG. 4, the four global signals $\phi 1$, $\phi 2$, IS and MS belonging to the MTC signal directly control, except for intervening fanout distribution circuitry, all of the SPFF's. $\phi 1$ and $\phi 2$ are two non-overlapping clocks. The pulse duration of the clock pulses must be long enough to permit proper latching by the master and slave latches in the SPFF's. The time from the leading edge of $\phi 1$ must be greater than the worst-case maximum delay through the combinational part of the mission logic circuit. All data inputs to the SPFF's must remain stable prior to and during the entire $\phi 1$ clock pulse. All asynchronous feedback loops are eliminated by the insertion of a SPFF in each loop. The data input of each SPFF must not be a combinational function of the clock signals, and the output function circuits feeding the primary outputs must not contain any reconvergent fanouts.

In designing the multiplexed-access scan testable (MAST) apparatus, to determine the number of possible scan paths that one might have, assume that n ≦ m, where:

n = number of primary inputs
m = number of primary outputs
Let p ≙ number of scan paths
Min p: without changing any I/O pins to bidirectional, then p = n
Max p: change as many I/O pins as possible to bidirections, then $$p = \left\lfloor \frac{n + m}{2} \right\rfloor$$

where ⌊ ⌋ denotes the "floor" number
Then $$n \leq p \leq \left\lfloor \frac{n + m}{2} \right\rfloor$$

given p, the length of each scan path is $$L = \left\lceil \frac{f + t}{p} \right\rceil$$

where
f = total no. of mission flip-flops
t = no. of added flip-flops for testability purposes (transparent SPFF's)
⌈ ⌉ denotes the "ceiling" number.

The fragmentation of the scan path structure, i.e., empty locations in the rectangular scan structure, would be g = p·L − (f+t) where p·L is the maximum number of SPFF's that can be placed in the p×L rectangle and (f+t) is the total number of flip-flops in the circuit. So the goal for this part is to minimize both L and g. L determines the test time for the scan path, and g represents "inefficiency" in the sense that it represents a number of un-occupied or empty locations in the rectangle.

Another consideration is hardware overhead (OH). Let $OH_{FF} \triangleq$ overhead due to the use of SPFF's to replace conventional FF's $OH_{MUX} \triangleq$ overhead due to the multiplexing of test primary I/O with the mission primary I/O $OH_{DIR} \triangleq$ overhead due to the conversion of some I/O lines to be bidirectional in order to support scan path I/O's For $OH_{FF}$ equation derivation, let:

$f \triangleq$ No. of mission $FF$'s
 = No. of $SPFF$'s
$t \triangleq$ No. of added $SPFF$'s
 = No. of transparent $SPFF$'s $(TSPFF)$ Assume SPFF requires $\approx 3$ additional transistor pairs in CMOS Gate Array Assume TSPFF requires $\approx 14$ additional transistor pairs $\therefore OH_{FF} = f \cdot 3 + t \cdot 14$ transistor pairs (tp)

For $OH_{MUX}$ equation derivation, each scan path I/O requires one 1:2 DMUX ($\approx 3$ tp) and one 2:1 MUX ($\approx 3$ tp)

$\therefore OH_{MUX} = p \cdot (3+3) = 6 \cdot p$ (tp) where p = number of scan paths.

For $OH_{DIR}$ equation derivation, let:

$b \triangleq$ number of pins that are made bidirectional.

Assume each bidirectional pin requires an addition of $\approx 4$ tp (estimate) $\therefore OH_{DIR} = b \cdot 4$ (tp)

Total hardware overhead is:

$$OH = OH_{FF} + OH_{MUX} + OH_{DIR}$$
$$= 3f + 14t + 6p + 4b \text{ transistor pairs}$$

Thus another goal is to minimize OH.

Next, we will estimate the number of test vectors needed to test the circuit, using single-stuck-line model. Let $d \triangleq$ number of fanout destinations in the combinational part $f_o \triangleq$ number of inputs to combinational part from the FF outputs (feedback paths)

Then the number of test vectors needed when the bistable elements are removed is estimated to be $V = 2 (n+d+f_o)$. This is an upper bound.

The actual value of V can be obtained from an ATPG program.

Knowing the number of test vectors, one can compute the test time. Let $TT \triangleq$ test time of a chip.

$$TT = \underbrace{V(L+1)}_{\text{For checking combinational part}} + \underbrace{L+5}_{\text{For checking scan path(s)}}$$

Figure 10:
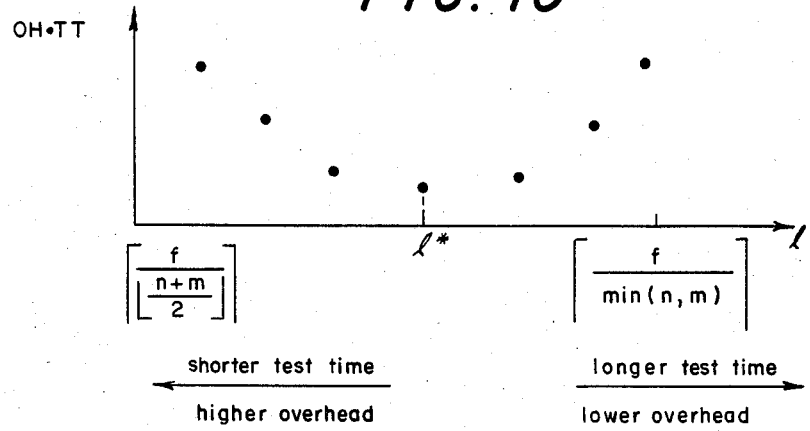
FIG. 10 is a plot illustrating the optimum value of scan path length 1.

The time to check the scan path(s) is made up of the time to scan the pattern 01100 into the scan paths. Because the path is L bits long and the pattern is 5 bits long so the total time required is L+5. To check the combinational part, the sequential part of each of the V vectors is scanned in. Once the sequential part of a test vector has been scanned in, the whole circuit is placed in the mission mode and clocked once. Thus, L clock pulses are needed to do the scanning, and one master clock pulse is needed to do the clocking of the whole circuit, or (L+1). One can use a composite optimization factor to guide in the selection of L. We will use OH·TT as the composite optimization factor. For a given value of L, there is one value of p which yields the smallest value of g, the number of empty locations. Let p* = the best value of p for a given L (i.e., smallest g). Now we will plot OH·TT. Note that TT is a monotonically increasing function of L. OH is a monotonically increasing function of p. But p = f/L. So OH is monotonically decreasing as a function of L. The plot of OH·TT as a function of L is shown in FIG. 10.

Thus we see that there is an optimum value for L at $L^*$.

Figure 12:
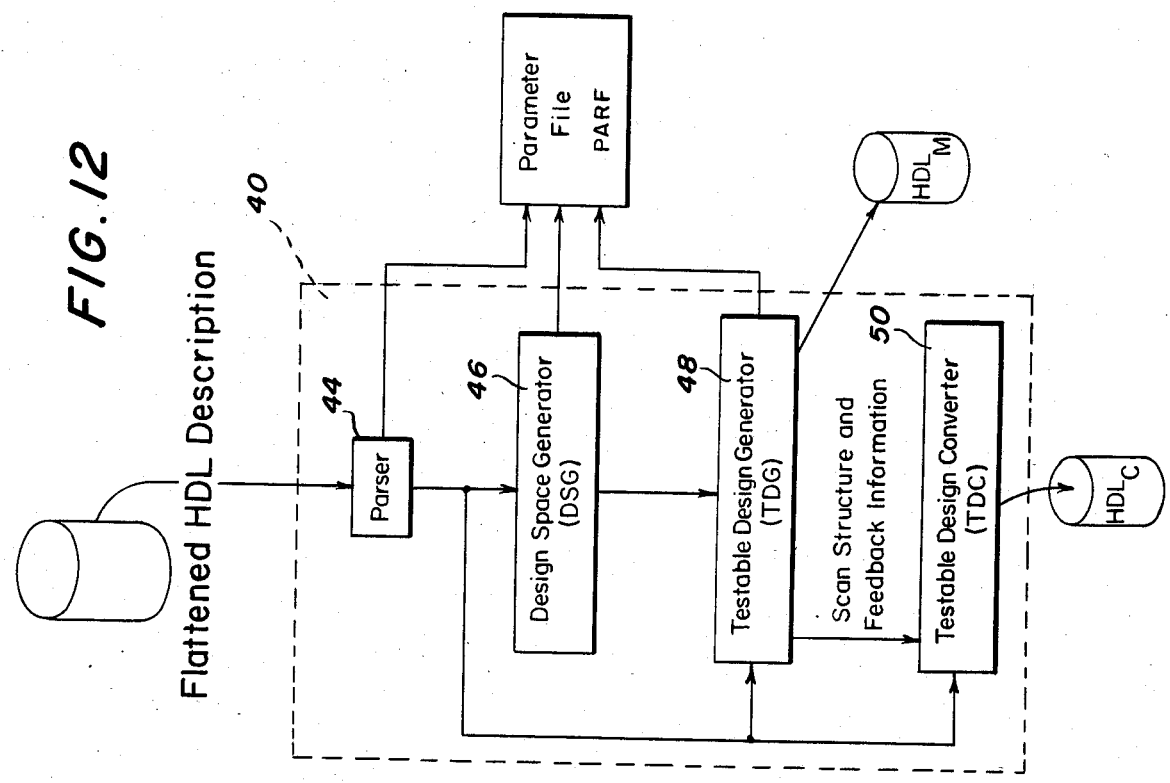
FIGS. 11 and 12 illustrate the system for obtaining the test vectors for testing the sequential and combinational circuits.
Figure 11:
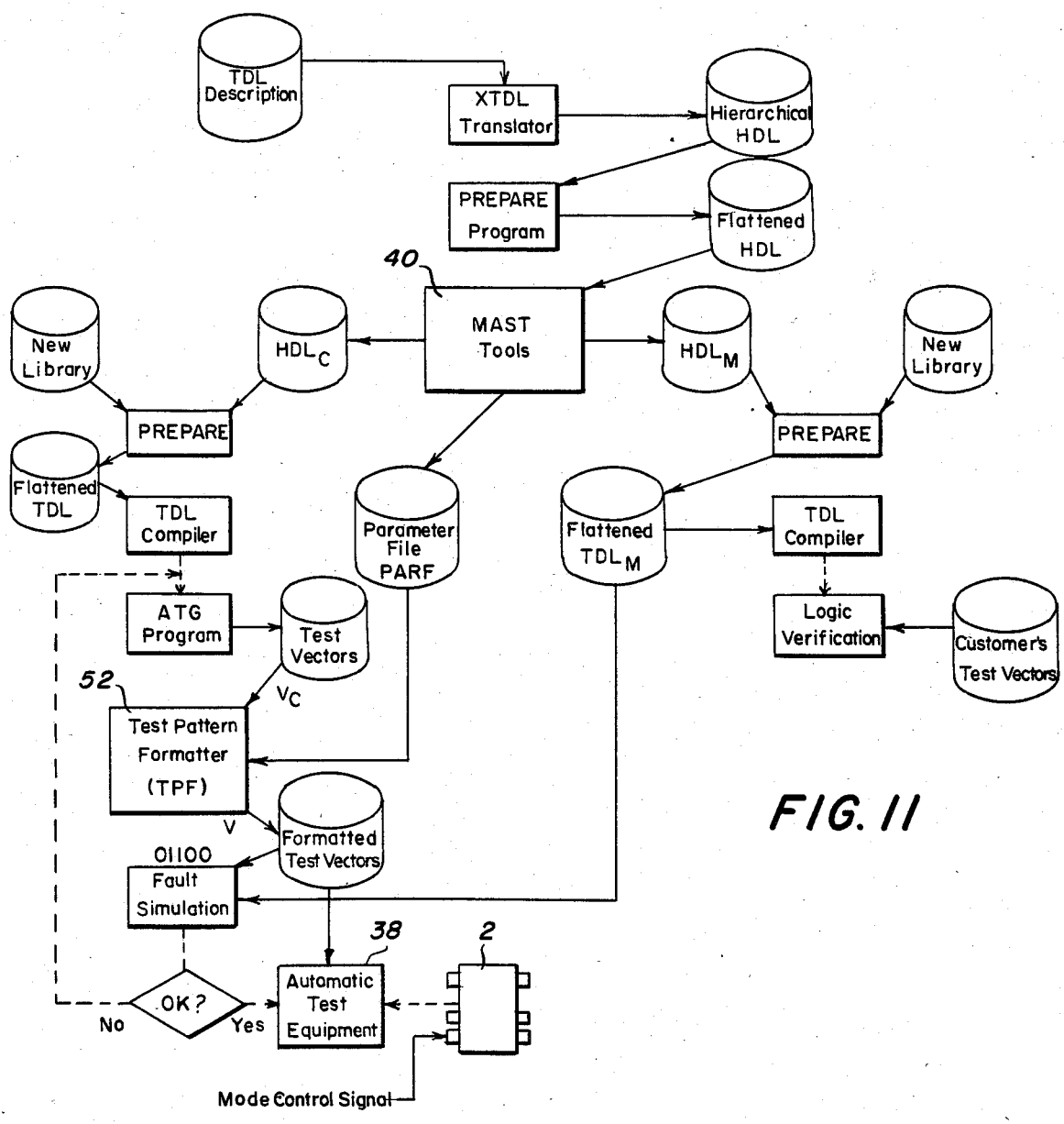

In summary, the procedure involves the following steps:

(1) Given n, m and f, obtain the value of $L^*$
(2) Determine $p^*$
(3) Add MUX's and DMUX's to multiplex between the scan paths and the mission primary I/O's
(4) Replace all mission FF's with SPFF's
(5) Add scan in/out lines
(6) Add mode select line and test clock lines Referring now to FIGS. 11 and 12, the IC chip 2 to be tested is plugged into a conventional automatic test system 38 (such as the GenRad tester Model GR 16, for example). The software tools in these figures was developed on a VAX 11/780 computer running under a VMS operating system and an in-house CADEXEC environment. The CADEXEC environment consists of a number of computer aided design (CAD) tools for schematics capture, design layout, placement, routing, test pattern generation, fault simulation, testability analysis, timing delay analysis, and mask pattern generation. The programs used for test pattern generation, logic verification, fault simulation, and testability analysis constitute a software system called TEGAS which is available commercially. The MAST concept refers to the idea of making a design testable as discussed above. FIG. 11 depicts the environment in which the MAST tools operate in, and FIG. 12 shows the components of the MAST tools 40. In addition to the MAST tools, one more tool, called Test Pattern Formatter (TPF), (FIG. 11) was also developed. For reference, the Test Pattern Formatter will also be referred to as part of the MAST tools. All of the MAST tools were written in the C language. The input file to the MAST tools is the description of the original circuit. This description is written in a language called Tegas Description Language (TDL). Intermediate output files are created in the process of generating the final testable design. These intermediate output files are hierarchical and flattened (expanded) Hardware Description Language (HDL) files. The flattened HDL file is used as the input to the MAST tools because it is the required format used by the current CADEXEC system. Other intermediate files are HDLM and HDLC where M stands for Modified, that is, the version of the circuit which has been modified to include scan path structure, and C stands for Combinational, that is, the version of the circuit in which the bistable elements have been removed and only the combinational part is left. The final output files consist of the flattened TDLM and formatted test vector file.

The following software tools were developed and implemented:

(A) Test-set size estimator (TSE)

TSE computes the number of test vectors needed to test the combinational part of the circuit after the bistable elements have been removed. The formula used is
V = 2 (n + d + $f_o$)

n = # of primary inputs d = # of fanout destinations in the combinational part $f_o$ = # of feedback lines from the bistable elements to the combinational part (B) Parser The Parser 44 identifies and enumerates the following characteristic parameters of the circuit: n, d, $f_o$, m, and f wherein m = 190 of primary outputs f = # of bistable elements (C) Design Space Generator (DSG)

DSG 46 computes the range of p, L, and OH·TT where p = # of parallel scan paths

L = # of bistable elements per path

OH·TT = amount of composite overhead which is made up of chip area overhead and testing time, TT In addition, DSG selects an optimum choice of p and L such that OH·TT is minimized.

(D) Testable Design Generator (TDG)

Given a design choice of p and L, TDG 48 replaces all original bistable elements with the scan path flip-flops (SPFF), and partitions the SPFF's into p* sets, where p* denotes the optimum number of scan paths, chains all SPFF's in each set into a scan path, adds multiplexers/demultiplexers to multiplex/demultiplex scan path IOs with mission I/Os, and, if needed, adds bidirectional buffers to one or more of the I/O pins. In effect, TDG incorporates scan-path structure into the original circuit.

(E) Testable Design Converter (TDC)

TDC 50 removes all of the bistable elements in the modified circuit which has the scan-path structure in it. The resulting circuit is one which has only combinational elements. When testing the combinational portion of the circuit, the inputs (outputs) of the sequential elements will appear to be additional primary (pseudo) outputs (inputs) of the combinational portion. This circuit is used by ATG to generate test vectors for the combinational portion. This new description is referred to as HDLC.

(F) Test Pattern Formatter (TPF)

TPF 52 takes the test vectors generated for the combinational version of the circuit by the automatic test pattern generation (ATG) program and converts them into a form usable by the scan path version of the circuit. The test vectors from the generator have all the patterns to be shifted into the scan paths in "parallel", i.e., combined into a single vector. TPF "serializes" these patterns and adds the appropriate control patterns so that the scan path data is sequentially scanned in during test mode, then the circuit is switched to mission mode and clocked. The next set of scan path patterns goes in as the scan path outputs are read out. For a circuit with scan length L, each vector ATG generates for the combinational circuit is transformed into (L+1) vectors. L of these vectors are used to load the scan path flip-flops during test mode, and one vector is used to clock the circuit during mission mode.

The total number of vectors generated by TPF is $[V(L+1)+5] \times 2$

The reason for the 5 is that we need to apply the pattern 01100 (five bits) to the scan paths. The reason for the 2 is that there are two vectors per clock period, one for each phase of the clock. If the circuit under test has a master reset or master set input, then additional vectors would be needed.

In a typical testing operation, the following steps are taken at the indicated times:

T1 apply control signal MTC to place the circuit in the test mode;

T2 apply the test signal pattern (01100, in the described example) in a bit by bit manner, and clock L plus 5 times, monitoring the respective outputs to given an indication of the conditions of the SPFF's of the various scan paths;

T3 apply the control signal to obtain the test mode, and apply to the scan path inputs composite vectors each having a first part which conditions (via the SPFF's) the combinational circuits, and a second part containing a test signal input to the combinational circuits;

T4 change the polarity of the test mode control signal to place the circuit in the mission mode;

T5 clock the circuit once to capture into the scan path flip-flops (SPFF's) the conditions of the combinational circuits;

T6 place the circuit in the test mode by applying a control signal; and

T7 clock the scan paths L times and monitor the outputs to determined the conditions of the combinational circuits.

The testing process is repeated until all the vectors are exhausted.

As an application example, the MAST tools have been applied to a circuit called Successive Approximation Register (SAR). SAR consists of a 12-bit register and is used as a part of an analog-to-digital converter circuit. The original SAR circuit does not have scan-path structure in it. Each sequential element in SAR is a latch, not a master-slave flip-flop. In order to conver SAR into a MAST circuit, each latch has to be replaced by a scan-path type of master-slave flip-flop. Because of this, the overhead is very high. Specifically, the overhead per replacement of a latch by a master-slave flip-flop can be computed as follows:

Number of cells per latch = $2\frac{1}{3}$

Number of cells per master-slave flip-flop = 6

The increase is $6 - 2\frac{1}{3} = 3\frac{2}{3}$ cells per latch, and there are 6 transistors per cell. So the increase is $3\frac{2}{3} \times 6 = 22$ transistors.

There are 12 stages in SAR. So the total increase is $12 \times 22 = 264$ transistors.

The total number of test vectors generated by ATG is 176. The total number of vectors generated by TPF is $[176 \times (4+1) + 5] \times 2 = 1770$. The fault coverage is 96.1%. When ATG was applied to the original circuit which has no scan path structure, only 1 vector was generated, and the fault coverage was only 0.16%.

In summary, the notion of very large scale integration is based on the idea that an extremely large amount of electronic circuitry can be placed on a tiny silicon chip. It is understood that by so doing, the number of pins on the integrated package is approximately equal to the essential input/output leads needed for the chip to communicate with the external world. What this means is that only those pins which are really essential will be kept. This is consistent with the idea of keeping the package small. However, this very idea of keeping the number of pins small places a limitation on test access. In the LSSD methodology, all of the sequential elements are chained together to form one long chain. No multiplexing is done to share the mission data pins. Thus there is a need to assign a pin to the test-data input and also a pin to the test-data output. Because there is only one chain, the total test time may be long. In the MAST methodology, the test time is reduced because the sequential elements are partitioned into multiple chains of shorter length than that of one single chain. There is no need to assign special pins for test-data inputs/outputs because these lines are multiplexed with the mission-data input/output lines. Additionally, if the number of scan paths is high, a second level of multiplexing can be used to further distribute the test-data input signals among the scan paths.

Based on the results obtained, the MAST methodology is quite effective. The methodology must be viewed with the following factors in mind:

(A) The complexity and functionality of semicustom VLSI circuit will continue to increase. Being able to partition a circuit so that multiple scan paths are obtained will help to speed up the testing process.

(B) As time goes by, the cost of the overhead in transistors will decrease. Therefore, the overhead due to the additional circuitry placed in the circuit due to the MAST methodology will be increasingly acceptable.

(C) The value of MAST in reducing testing time will increase as circuit complexity increases because, without multiplexing, the testing time will go up as a function of the number of bistable elements.

(D) Chip testing time is a recurring cost. That is, it occurs each time a chip is tested. By cutting down this recurring testing time and therefore cost for each chip, the total time and money saved are substantial.

What is claimed is:

1. A testable digital integrated circuit chip having input and output pins, respectively, comprising
   (a) a plurality of bistable circuit elements;
   (b) a plurality of combinational circuit elements;
   (c) first means operable in a mission mode for connecting said bistable and combinational circuit elements to define mission logic means having input and output ends;
   (d) second means operable in a test mode for connecting groups of said bistable elements in series to define a plurality of serial scan paths isolated from said combinational circuit elements, each of said scan paths having input and output ends;
   (e) first level demultiplexer means having outputs connected with the input ends of said serial scan paths, respectively, said first demultiplexer means having input means;
   (f) second level demultiplexer means having first outputs connected with said first demultiplexer input means, respectively, and second outputs connected with the input end of said mission logic functions, respectively, said second demultiplexer means having input means connected with the chip input pins;
   (g) first level multiplexer means having a plurality of inputs connected with the output ends of said scan paths, respectively, said first multiplexer means having output means;
   (h) second level multiplexer means having first inputs connected with the first multiplexer output means, respectively, and a second set of inputs connected with the output ends of said mission logic functions, respectively, said second multiplexer means having output means connected with the chip output pins;
   (i) mode control means for operating said demultiplexing and multiplexing means to switch said integrated circuit between said mission and test modes;
   (j) means for applying a test signal to said input pins when said integrated circuit is in the test mode; and
   (k) means for monitoring the resultant test signal appearing at the integrated circuit output pins.

2. Apparatus as defined in claim 1, wherein each of said bistable elements includes flip-flop multiplexer means operable by said mode control means to switch said bistable element between mission and test operating modes, whereby each bistable element constitutes a scan path flip-flop.

3. Apparatus as defined in claim 2, and further including clock means for applying clock signals to said scan path flip-flops when the integrated circuit is in the test and mission modes.

4. Apparatus as defined in claim 3, wherein each of said scan path flip-flops includes series-connected master and slave latch means.

5. Apparatus as defined in claim 4, wherein said clock means comprises a two-phase clock for clocking said master and slave latches, respectively.

6. Apparatus as defined in claim 5, wherein said test signal applying means is operable to initially apply a binary test pattern to the input of each of said scan paths, said scan path being clocked a number of times corresponding with the number of scan path flip-flops contained in the scan path, plus the number of bits of said binary test pattern.

7. Apparatus as defined in claim 6, wherein said test signal applying means is subsequently operable to apply to the scan path inputs a composite vector signal a first part of which is operable to condition the combinational circuits via the scan path flip-flops, and a second part of which is operable to test the combinational circuits.

8. The method of testing the bistable and combinational circuit elements of an integrated circuit chip normally connected to define an operational function mission logic, each bistable element comprising a scan path flip-flop operable between mission and test modes, which comprises the steps of
   (a) connecting groups of the scan path flip-flops in a test mode to define a plurality of scan paths isolated from the combinational elements;
   (b) alternately connecting said scan paths and said mission logic between the input and output pins of the integrated circuit by multi-level multiplexer means operable between test and mission modes, respectively;
   (c) applying a control signal to place said scan path flip-flops and said multiplexer means in the test mode;
   (d) applying a binary test pattern signal to the inputs of said scan paths via the input pins of the integrated circuit;
   (e) clocking each scan path a number of times corresponding to the number of scan path flip-flops contained in the scan path, plus the number of bits in said binary test pattern; and
   (f) monitoring the output of each scan path via the integrated circuit output pins, thereby to determine the correct operation of the bistable elements of the scan paths, respectively.

9. The method as defined in claim 8, and further including the steps of
(g) subsequently applying to the inputs of the scan paths when the integrated circuit is in the test mode composite vectors containing a first part operable to condition the combinational circuits via the scan path flip-flops, and a second part for testing the combinational circuits;

(h) applying a control signal to place the integrated circuit in the mission mode;
(i) clocking the integrated circuit once to capture into the scan path flip-flops the conditions of the combinational circuits;
(j) applying a control signal to place the integrated circuit in the test mode;
(k) clocking the circuit a number of times corresponding to the number of scan path flip-flops in each scan path; and
(l) monitoring the outputs to determine the operating conditions of the combinational circuits.

* * * * *